United States Patent
Wu et al.

(10) Patent No.: US 6,387,599 B2
(45) Date of Patent: May 14, 2002

(54) CORROSION INHIBITOR OF NICU FOR HIGH PERFORMANCE WRITERS

(75) Inventors: Xuehua Wu, Union City; Yi-Chun Liu, Fremont; Jei-Wei Chang, Cupertino; Kochan Ju, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/756,013

(22) Filed: Jan. 8, 2001

Related U.S. Application Data

(62) Division of application No. 09/483,931, filed on Jan. 18, 2000.

(51) Int. Cl.$^7$ ................................................. G03F 7/30
(52) U.S. Cl. ............................................................ 430/312
(58) Field of Search ................................ 430/312, 331

(56) References Cited

U.S. PATENT DOCUMENTS

| | | | |
|---|---|---|---|
| 5,236,552 A | 8/1993 | Fang | ........................ 156/659.1 |
| 5,304,252 A | 4/1994 | Condra et al. | .................. 134/2 |
| 5,316,573 A | 5/1994 | Brusic et al. | ............. 106/14.16 |
| 5,635,339 A | 6/1997 | Murray | ......................... 430/350 |
| 5,792,274 A * | 8/1998 | Tanabe et al. | ................ 134/1.3 |
| 5,863,710 A | 1/1999 | Wakiya et al. | .............. 430/331 |

OTHER PUBLICATIONS

Derwent No. 1989–302227, Apr. 10, 1997.*

* cited by examiner

*Primary Examiner*—Hoa Van Le
(74) *Attorney, Agent, or Firm*—George O. Saile; Stephen B. Ackerman

(57) ABSTRACT

The problem of copper corrosion that occurs in the presence of strong alkaline developing solutions during photo rework has been overcome by protecting all exposed copper bearing surfaces from attack. Two ways of achieving this are described. In the first method, benzotriazole (BTA) is added to the developing solution which is then used in the normal way, developing time being unaffected by this modification. In the second method, the surface that is to receive the photoresist is first given a dip in a solution of BTA, following which the photoresist is immediately applied and processing, including development, proceeds as normal. For both methods the result is the elimination of all copper corrosion during development.

4 Claims, 3 Drawing Sheets

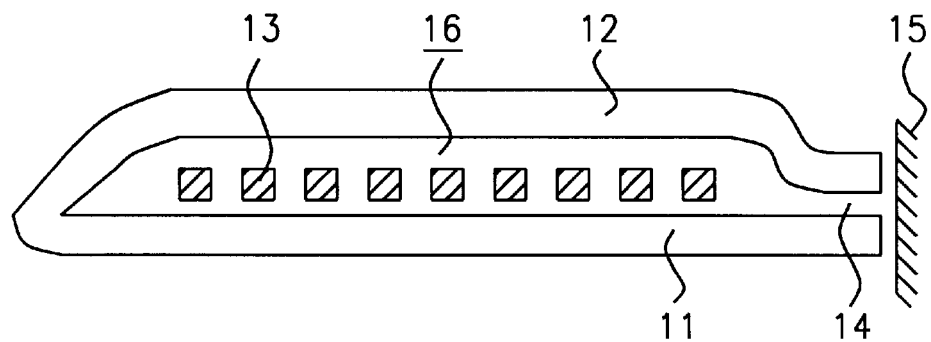
*FIG. 1 - Prior Art*
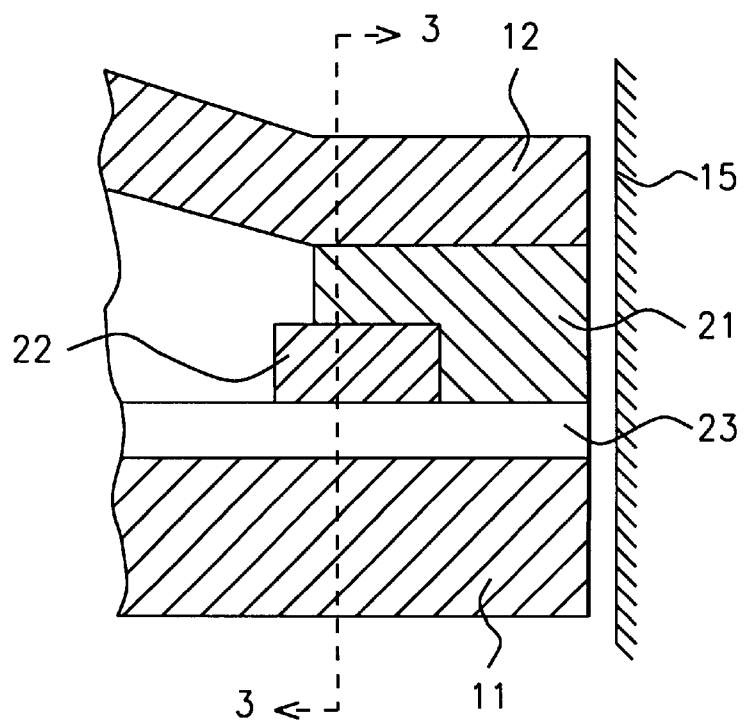
*FIG. 2*

CORROSION INHIBITOR OF NICU FOR HIGH PERFORMANCE WRITERS

This is a division of patent application Ser. No. 09/483,931, filing date Jan. 18, 2000, Corrosion Inhibitor Of Nicu For High Performance Writers, assigned to the same assignee as the present invention.

FIELD OF THE INVENTION

The invention relates to the general field of photoresist processing in the presence of copper, with particular application to the manufacture of write heads for magnetic disk systems.

BACKGROUND OF THE INVENTION

Referring to FIG. 1, we show, in schematic representation, a cross-sectional view of a write head for a magnetic disk system. The magnetic field needed to perform the write operation is generated by flat coil 16 made up of a number of turns, with 13 being an example of one side of a single turn. Surrounding the flat coil is magnetic material comprising upper and lower pole pieces 12 and 11 respectively. These pole pieces are joined at one end (on the left in this figure) and are separated by small gap 14 at the other end. The magnetic field that is generated by flat coil 16 ends up being concentrated at gap 14. It is sufficiently powerful that the fringing field that extends outwards away from gap 14 is capable of magnetizing the magnetic storage medium over whose surface 15 the head 'flies'. The distance between gap 14 and surface 15 is typically between about 10 and 50 nm.

In the course of manufacturing the various layers that make up the gap region it is often found to be convenient to use copper, either alone or in combination with other materials, in one or more of the layers. As is well known, most or all of these layers will be shaped by means of photolithography. Additionally, a given photolithographic step may not always be implemented exactly as intended, for example misalignment between related structures may have occurred. Under such circumstances it is often possible to strip the unsatisfactory layer of photoresist and repeat the photolithographic step, a process referred to as photo rework.

Certain types of photoresist (notably positive resists) are developed using solutions that are very alkaline, typically having a pH in the range from 10 to about 14. In most cases this poses no problems. However, when one of the aforementioned pure or partial copper layers comes into contact with such a high pH solution, it is subject to attack. Thus, when using alkaline developers, any exposed copper must either be kept away from the developer or some way must be found to render the copper immune to attack. The present invention discloses a solution that is based on the second of these alternatives.

No references that describe the exact process of the present invention were uncovered in the course of a routine search of the prior art. Several references of interest were, however, found. For example, U.S. Pat. No. 5,236,552 (Fang) shows a photoresist stripping solution containing a corrosion inhibitor such as BTA. U.S. Pat. No. 5,863,710 (Wakiya et al.) shows a developer solution with an aluminum corrosion inhibitor. U.S. Pat. No. 5,635,339 (Murray) shows a photo-thermographic element using BTA as a co-developer. U.S. Pat. No. 5,316,573 (Brusic et al.) forms a corrosion inhibiting layer by dipping in a solution of copper and BTA. U.S. Pat. No. 5,304,252 (Condra et al.) shows a mask removing process with a corrosion inhibitor of BTA for a printed circuit board.

SUMMARY OF THE INVENTION

It has been an object of the present invention to provide a process for developing photoresist in the presence of copper bearing material without corroding the latter.

Another object of the invention has been to be able to perform photo rework in the gap region of the write head of a magnetic disk system without affecting copper bearing surfaces nearby.

These objects have been achieved by protecting all exposed copper bearing surfaces from attack by strongly alkaline solutions of the type used to develop photoresist. Two ways of achieving this are described. In the first method, benzotriazole (BTA) is added to the developing solution which is then used in the normal way, developing time being unaffected by this modification. In the second method, the surface that is to receive the photoresist is first given a dip in a solution of BTA, following which the photoresist is immediately applied and processing, including development, proceeds as normal. For both methods the result is the elimination of all copper corrosion during development.

BRIEF DESCRIPTION OF THE DRAWINGS

FIG. 1 is a schematic cross-section of a write head for a magnetic disk system.

FIG. 2 is a closeup view of the gap region of the write head seen in FIG. 1.

DESCRIPTION OF THE PREFERRED EMBODIMENTS

In FIG. 2 we show (schematically) a closeup view of the gap region that is part of FIG. 1. In order to concentrate the magnetic flux to the maximum extent possible, the size of the upper pole piece is reduced in the immediate vicinity of the gap. Thus, in addition to the upper and lower pole pieces, 12 and 11 respectively, seen in FIG. 1, a second upper pole piece 21 has been introduced between pole piece 12 and the gap layer 23, the latter being a layer of an insulating material such as alumina or nickel-copper. As can be seen, second pole piece 21 has been further reduced in cross-sectional area where its lower surface contacts gap layer 23.

This reduction in area of the lower portion of 21 is conveniently implemented by introducing a layer of non-magnetic material, in the form of step 22, prior to the formation of 21. Because it can be processed in a manner similar to nickel-iron, nickel-copper (between about 40 and 70 weight % copper) has been found to be a suitable material from which to build the non-magnetic step 22.

Figure 3:
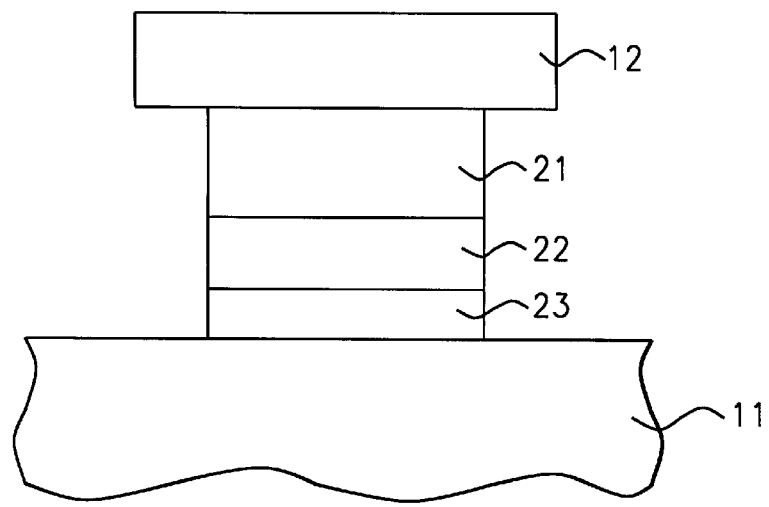
FIG. 3 shows the object illustrated in FIG. 2 viewed from a different direction.

FIG. 3 is a cross-section of FIG. 2 made through plane 3—3. Once lower pole piece 11 is in place, a layer 23 of gap material (such as alumina or nickel copper) is laid down to a thickness between about 1,000 and 4,000 Angstroms.

Figure 4:
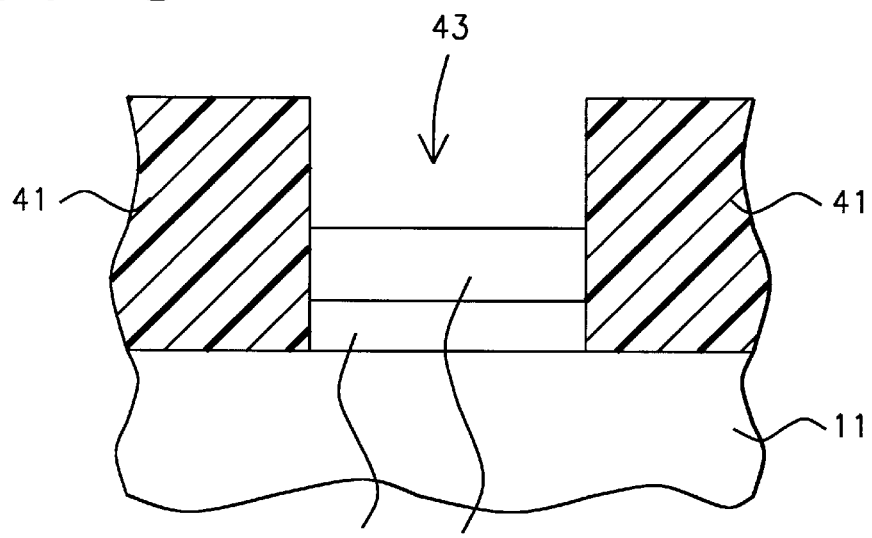
FIG. 4 shows a photoresist frame used for forming a non-magnetic step layer.

Referring now to FIG. 4, in order to form non-magnetic step layer 22, layer 41 of photoresist is first laid down and then patterned to form frame 43 inside which layer 22 can now be grown. With layer 22 in place, the same frame can be used to contain layer 21 while it is being grown. However, it is possible that the exact position of frame 43 relative to other parts of the structure is unsatisfactory, in which case photo rework becomes necessary.

It then becomes necessary to remove photoresist layer 41 and replace it with a fresh second photoresist layer which can be re-exposed and developed so as to locate frame opening 43 where it belongs. As previously noted, the developer is strongly alkaline so some of the copper within layer 22 is liable to be attacked, resulting in undesirable corrosion of the top surface of step 22. The present invention provides two ways to protect the copper from attack by the developer which we now disclose as two separate embodiments.

First Embodiment

Figure 5:
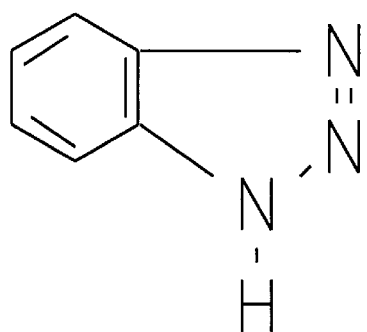
FIG. 5 shows the molecular structure of BTA.

In this approach, we modify the developer itself by adding to it a complexing agent that protects the copper from the alkaline solution. Although any one of several possible complexing agents could have been used, our preferred choice has been benzotriazole (BTA) which is added to a standard water based developer (such as LDD-26W) at a concentration between about 0.2 and 2 gms./liter. The molecular structure of BTA is illustrated in FIG. 5. The modified developing solution for the photoresist is then used in the normal way. That is, the photoresist is developed for a time period that is between about 2 and 10 minutes, this being the same time as that required for development in a developing solution having no BTA. Thus, the process is essentially unchanged, except that the copper corrosion no longer occurs.

Second Embodiment

In the second embodiment, the photoresist developer is not modified. Instead, after removing the misaligned layer of photoresist, the structure is dipped in an aqueous solution of BTA (at a concentration of between about 0.5 and 2 gms./liter for between about 0.5 and 15 minutes. It is then immediately coated with a fresh layer of photoresist which is then exposed and developed in the usual way. The presence of the BTA solution at the interface between the photoresist and the copper-bearing layer is then sufficient to prevent any corrosion of the copper from occurring during photoresist development. Note that the photoresist is developed for a time period that is between about 2 and 10 minutes, this being the same time as that required for development even if no pre-dip in a BTA solution has taken place.

For both embodiments, following the successful development of the photoresist, the new, correctly located, frame is now in position so that part 12 of the upper pole piece can be formed without part 21 being attacked. Finally, the reworked layer of photoresist is removed.

Figure 6:
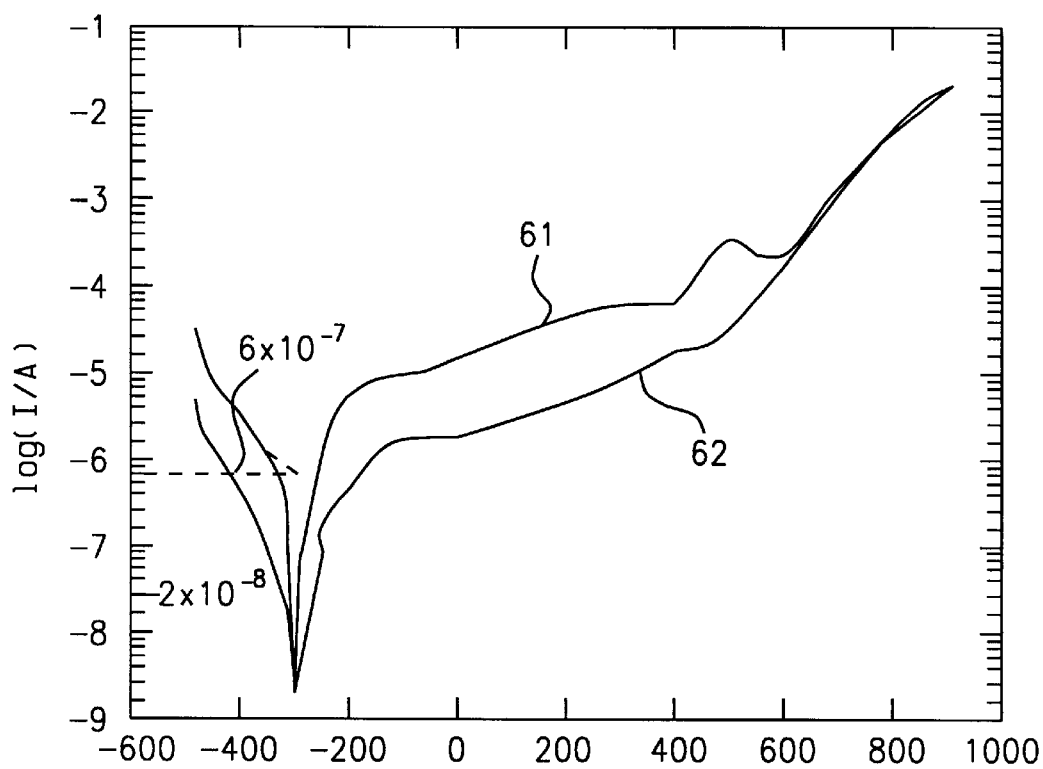
FIG. 6 is a polarization curve for a nickel-copper alloy in developing solutions with and without added BTA.

By way of explaining why the process of the present invention is effective in suppressing the dissolution of copper in alkaline solution, we refer to FIG. 6. which is a polarization curve for $Cu_{60}Ni_{40}$ in an unmodified developing solution (curve 61) and $Cu_{60}Ni_{40}$ in a developing solution to which 1.0 gm/liter of BTA has been added (curve 62). In both cases a plot was made of Log (I/A), where I and A are current and area respectively, vs voltage between an electrode made of the NiCu alloy and a standard calomel reference electrode. These curves show that the exchange current decreases by 1½ orders of magnitude when BTA is added. This shows that the addition of the BTA has substantially reduced the dissolution rate of the NiCu.

Figure 7:
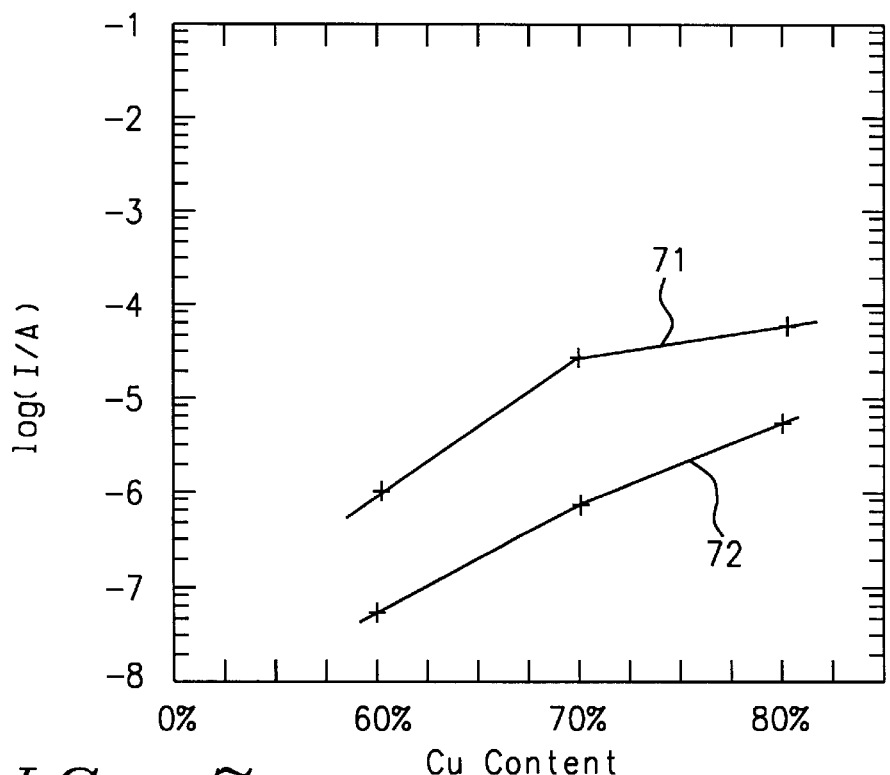
FIG. 7 plots the exchange current as a function of copper content for a nickel-copper alloy in developing solutions with and without added BTA.

In FIG. 7 we plot the exchange current density (log I/A) as a function of copper content within the NICu alloy. Curve 71 is for the unmodified developer while curve 72 is for the developer with 1 gm/liter of BTA added. This data shows that the exchange current will decrease with BTA addition for NiCu films having different copper concentrations. This demonstrates that BTA addition is effective to inhibit corrosion of NiCu films over the full range of copper content.

While the invention has been particularly shown and described with reference to the preferred embodiments thereof, it will be understood by those skilled in the art that various changes in form and details may be made without departing from the spirit and scope of the invention.

What is claimed is:

1. A process for doing photo re-work during manufacture of a write-head for a magnetic disk system, comprising:

providing a lower pole piece;

depositing a layer of gap material on the lower pole piece;

depositing and patterning a first layer of photoresist on the layer of gap material, thereby forming a first frame;

within said first frame, forming a step layer of a non-magnetic material that includes copper;

removing said first layer of photoresist;

depositing and exposing a second layer of photoresist on the step layer;

providing a developing solution for the photoresist;

modifying said developing solution by adding to it a quantity of BTA;

using the modified solution, developing the second layer of photoresist, whereby any copper in the step layer that comes into contact with the modified developing solution is unaffected by the development process, thereby forming a second frame.

within said second frame, forming an upper pole piece layer; and removing said second layer of photoresist.

2. The process of claim 1 wherein the quantity of BTA that is added makes its concentration in the developer to be between about 0.2 and 2 gms./liter.

3. The process of claim 1 wherein the resist is a positive photoresist.

4. The process of claim 1 wherein said non-magnetic material is an alloy of copper and nickel containing between about 40 and 70% copper.

* * * * *